(12) United States Patent
Ko et al.

(10) Patent No.: US 8,785,321 B2
(45) Date of Patent: Jul. 22, 2014

(54) LOW RESISTANCE AND RELIABLE COPPER INTERCONNECTS BY VARIABLE DOPING

(75) Inventors: Ting-Chu Ko, Taipei (TW);
Ming-Hsing Tsai, Taipei (TW);
Chien-Hsueh Shih, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 257 days.

(21) Appl. No.: 13/249,823

(22) Filed: Sep. 30, 2011

(65) Prior Publication Data

US 2012/0021602 A1 Jan. 26, 2012

Related U.S. Application Data

(62) Division of application No. 11/341,827, filed on Jan. 27, 2006, now Pat. No. 8,053,892, which is a division of application No. 10/637,105, filed on Aug. 8, 2003, now Pat. No. 7,026,244.

(51) Int. Cl.
*H01L 21/4763* (2006.01)

(52) U.S. Cl.
USPC ..................... 438/629; 438/622; 438/623

(58) Field of Classification Search
USPC .......................................... 438/622, 623, 629
See application file for complete search history.

(56) References Cited

U.S. PATENT DOCUMENTS

| | | | |
|---|---|---|---|
| 5,674,787 A | 10/1997 | Zhao et al. | |
| 5,969,422 A | 10/1999 | Ting et al. | |
| 5,972,192 A | 10/1999 | Dubin et al. | |
| 6,022,808 A * | 2/2000 | Nogami et al. | 438/694 |
| 6,207,222 B1 * | 3/2001 | Chen et al. | 205/123 |
| 6,228,759 B1 | 5/2001 | Wang et al. | |
| 6,319,834 B1 | 11/2001 | Erb et al. | |
| 6,344,129 B1 | 2/2002 | Rodbell et al. | |
| 6,387,806 B1 | 5/2002 | Wang et al. | |
| 6,469,387 B1 | 10/2002 | Lopatin et al. | |
| 6,525,425 B1 * | 2/2003 | Woo et al. | 257/758 |
| 6,551,872 B1 | 4/2003 | Cunningham | |
| 6,664,185 B1 | 12/2003 | Wang et al. | |
| 6,800,554 B2 * | 10/2004 | Marieb et al. | 438/687 |
| 6,815,357 B2 | 11/2004 | Homma et al. | |
| 6,875,692 B1 * | 4/2005 | Chang et al. | 438/687 |
| 6,911,229 B2 | 6/2005 | Andricacos et al. | |
| 6,943,111 B2 | 9/2005 | Lin et al. | |
| 2001/0008226 A1 | 7/2001 | Hung et al. | |
| 2001/0019892 A1 * | 9/2001 | Komai et al. | 438/687 |
| 2002/0115292 A1 | 8/2002 | Andricacos et al. | |
| 2003/0015793 A1 | 1/2003 | Merchant et al. | |
| 2003/0071355 A1 * | 4/2003 | Dubin et al. | 257/751 |
| 2003/0186540 A1 | 10/2003 | Ito et al. | |
| 2005/0006776 A1 | 1/2005 | Lin et al. | |
| 2005/0029659 A1 | 2/2005 | Ko et al. | |

* cited by examiner

*Primary Examiner* — James Mitchell
(74) *Attorney, Agent, or Firm* — Duane Morris LLP

(57) ABSTRACT

A method and system is provided for efficiently varying the composition of the metal interconnects for a semiconductor device. A metal interconnect according to the present disclosure has an intermediate layer on a dielectric material, the intermediate layer having a relatively higher concentration of an impurity metal along with a primary metal, the impurity metal having a lower reduction potential than the primary metal. The metal interconnect has a main layer of the metal alloy interconnect on top of the intermediate layer and surrounded by the intermediate layer, the main layer having a relatively higher concentration of the primary metal than the intermediate layer, wherein the intermediate and main layers of the metal alloy interconnect each maintains a material uniformity.

20 Claims, 3 Drawing Sheets

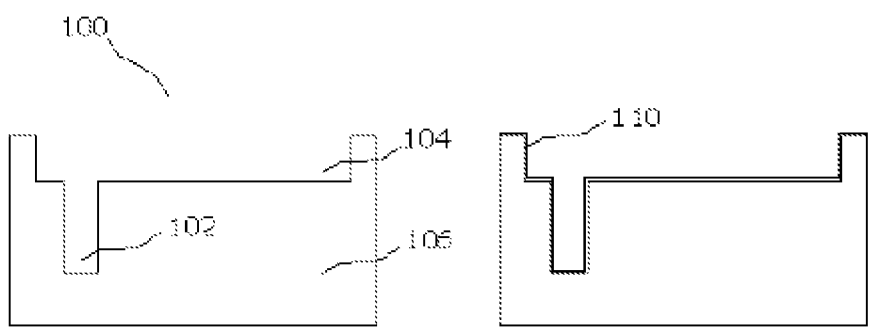
FIG. 1a
FIG. 1b
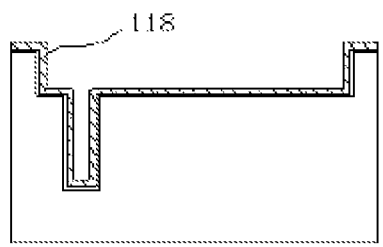
FIG. 1c

LOW RESISTANCE AND RELIABLE COPPER INTERCONNECTS BY VARIABLE DOPING

RELATED APPLICATIONS

This application is a divisional of application Ser. No. 11/341,827, filed Jan. 27, 2006 which is a divisional of application Ser. No. 10/637,105, filed Aug. 8, 2003, now U.S. Pat. No. 7,026,244. The disclosures of application Ser. No. 11/341,827 and application Ser. No. 10/637,105 are incorporated herein by reference in their entirety.

BACKGROUND

The present invention relates to semiconductor devices, and a method for manufacturing a semiconductor device having copper (Cu) interconnects. The present invention relates, in particular, to the formation of Cu interconnections with improved resistance to electromigration (EM). The present invention has particular applicability to high-density semiconductor devices with sub-micron design features.

Recently developed technology has placed more stringent demands on the wiring requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter using pure Cu for its desirable high conductivity. Accordingly, there is a need for electroplating methods, materials, and apparatus that can form very narrow conductive interconnects made from materials such as Cu.

Conventional Cu deposition focuses on the deposition of pure Cu. Recently the addition of dopants to the Cu has attracted attention because of the better resistance of doped Cu to electromigration and stress migration (SM). The dopant element forms intermetallic compounds with the Cu. In such cases, the Cu is typically deposited via a single electroplating process. That is, a single plating solution employing one type of plating chemistry is used to deposit the material that forms the interconnects.

This use of Cu alloys may help solve electromigration problems, but including the dopant throughout the entire interconnect increases the resistivity of the interconnect. This increased resistivity leads to slower performance associated with the semiconductor device.

What is needed is an improved method for forming copper interconnects.

SUMMARY

A method and system is provided for efficiently varying the composition of the metal interconnects for a semiconductor device. A metal interconnect according to the present disclosure has an intermediate layer on a dielectric material, the intermediate layer having a relatively higher concentration of an impurity metal along with a primary metal, the impurity metal having a lower reduction potential than the primary metal. The metal interconnect has a main layer of the metal alloy interconnect on top of the intermediate layer and surrounded by the intermediate layer, the main layer having a relatively higher concentration of the primary metal than the intermediate layer, wherein the intermediate and main layers of the metal alloy interconnect each maintains a material uniformity.

For varying the composition of the metal interconnects, in one example, a variable plating voltage is used to drive the electro-chemical deposition from a plating solution containing a predetermined impurity metal/dopant. For properly designed equipment, the relative composition of the primary metal and its dopants deposited at a given time will depend on the plating voltage imposed so that the dopant profile of the interconnect can thereby be easily controlled.

These and other aspects and advantages will become apparent from the following detailed description, taken in conjunction with the accompanying drawings, illustrating by way of example the principles of the disclosure.

BRIEF DESCRIPTION OF THE DRAWINGS

FIGS. 1a-1g graphically illustrate the fabrication process of a single level of metalization with metal interconnects according to one example of the present disclosure.

DESCRIPTION

The present disclosure provides an improved method for forming metal interconnects. The fabrication of the metal interconnects would follow the industry standard Damascene Metalization (DM) or Dual-Damascene Metalization (DDM) techniques. In the context of integrated circuits the term 'Damascene' implies a patterned metal layer imbedded into an insulating layer such that the top surfaces of the two layers are coplanar.

Figure 1D:
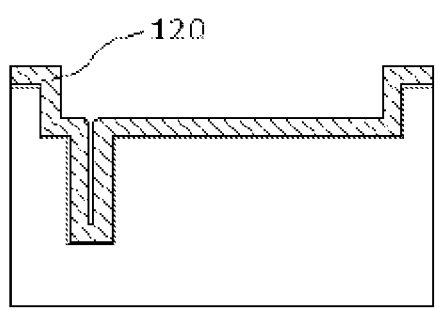

FIGS. 1a-1g illustrate a fabrication process for forming metal interconnects according to one example of the present disclosure. FIG. 1a illustrates a semiconductor device 100 in the fabrication process. It is assumed that a wafer has been completed through the standard Dual-Damascene metalization process. That is, via 102 and trenches 104 have already been etched into an underlying dielectric insulation layer 106.

Next, in FIG. 1b, a very thin, highly continuous "seed" layer of Cu 110 will be deposited by some suitable means known to those skilled in the art. This seed layer is the first of three layers, which will together constitute the current level of metalization.

In the next step, illustrated in FIG. 1c, deposition of an "intermediate layer" of Cu alloy 118 has begun. This intermediate layer 118 is deposited by an electroplating process generally referred to as ECP. It is desired that this intermediate layer 118 be composed of a relatively high level of dopant (e.g. tin) mixed with the Cu. This dopant element would generally be chosen to have a lower reduction potential than Cu.

The electroplating bath composition, temperature and the plating voltage are chosen to accomplish this high level of dopant. This plating voltage is supplied to the wafers through an electrical connection made to an electrically conductive wafer carrier and then through the electrically conductive seed layer. This plating voltage is applied for a controlled time period required to achieve a desired final thickness (as shown in FIG. 1d) for this intermediate metal layer 120. In practice, the plating voltage varies widely. For example, it can be between 1 mA/cm$^2$ to 50 mA/cm$^2$, with a bias between 0.2V to 8V. Additionally, the plating temperature is between 15 to 28° C., and the time duration for plating depends on the current employed, usually less than 2 minutes.

At this point, the via 102 will be mostly filled with the heavily doped metal alloy 120 as shown in FIG. 1d. As EM problems are frequently localized at the via 102 locations, so the high dopant content of this intermediate metal layer 120 is perfectly suited to minimize those EM problems. It is understood that the chip design rules for maximum electrical current density and maximum sheet resistance for this current level may make either the EM of the vias or the resistance (per unit length) of these minimum-width lines to be the tighter constraint. In case that the EM of the vias is the tighter restraint, it would be advantageous for these minimum vias and/or lines to be on the order of twice the thickness of the intermediate layer 120 as shown in FIG. 1d.

Figure 1E:
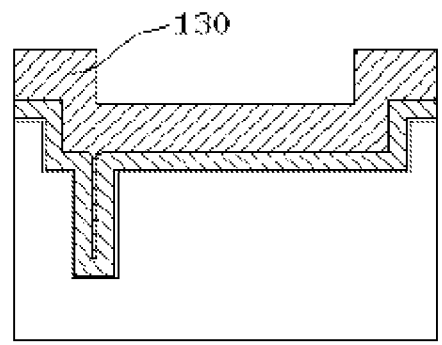

The next step, illustrated in FIG. 1e, is to deposit the "main layer" of the current level of Cu metal or Cu alloy 130 with a low concentration of impurities, also by ECP, without interrupting the deposition process, by simply adjusting the plating voltage (typically to a lower value close to zero) so as to minimize the dopant concentration in this main layer 130 of metal. Generally speaking, the main metal area has less impurity contents so that it is largely formed by lightly doped copper or pure copper due to consideration for resistivity. On the other side, the intermediate layer, which is the lower portion of the via, has the highly doped (or less pure) copper for EM concerns.

It is also understood that although the main layer of Cu is deposited without interrupting the standard deposition process, alternatively, this main layer 130 could be formed by using a separate deposition/plating step (probably using a separate ECP apparatus). In essence, this main layer of Cu 130 should have a desired minimum thickness to provide a conductive layer of a low enough electrical resistance plus a safe margin to allow for the future CMP step. And for that reason, the main layer 130 is generally thicker than the intermediate layer 120, as shown in FIGS. 1e, 1f, and 1g.

Figure 1F:
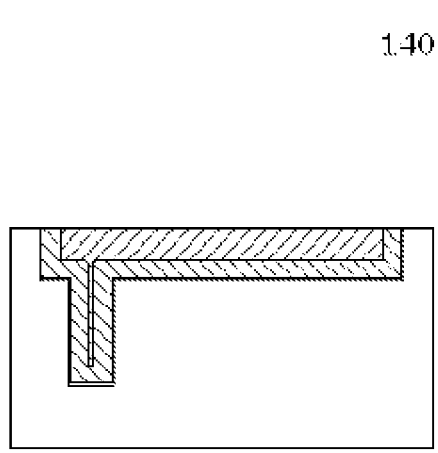
Figure 1G:
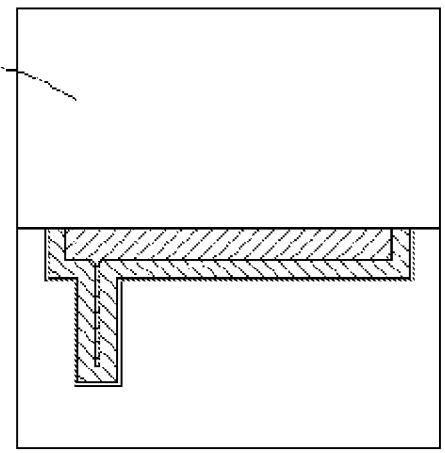

The next step, illustrated in FIG. 1f, is using CMP (chemical mechanical polishing) to remove all traces of metal (seed layer 110, intermediate layer 120, and main layer 130) located outside the trench and thus higher than the desired final top edges of the dielectric 110. Also note that according to standard DM/DDM procedure a sufficient amount of the top of the main layer 130 inside the trench, together with the top of the dielectric layer 106, will be sacrificially removed during the CMP process so that the surface of the wafer is coplanar, as shown in FIG. 1f.

All heat treatments following this step will have the effect of diffusing the dopant atoms from the intermediate layer into the adjacent seed and main layers of the current level of metalization. The initial deposition conditions should be chosen to take this additional dopant drive-time into consideration. In addition, the physical profile of the intermediate layer and the main layer may change due to other thermal processes for fabricating the semiconductor device.

At this point (FIG. 1f) the current level of metalization is complete. If another level of metalization is to be fabricated, a next layer of dielectric insulation 140 (illustrated in FIG. 1g) would be deposited, and the following level of DM or DDM metal would be formed in similar fashion to the level just described. If the current level of metalization were to be the last level, then following this step would typically come a so-called passivation (protective insulating) layer deposition (not shown).

It is further noted that it is impractical to reverse the compositions of the main and intermediate layers for reducing the EM due to the difficulty for controlling the desired concentration profile after several thermal cycles in later fabrication process. For example, if one uses Cu alloy seed, pure Cu for the intermediate layer, and doped Cu for the main layer, after multiple thermal cycles, it is very easy to have the intermediate and main layers lose their integrity and form an "entire doped metal interconnect" layer, thereby canceling the real advantage of having doped Cu in the metal interconnects. The other drawback for such an approach is the cost. A much higher cost will be incurred since it is a much more complicated fabrication process.

Figure 2:
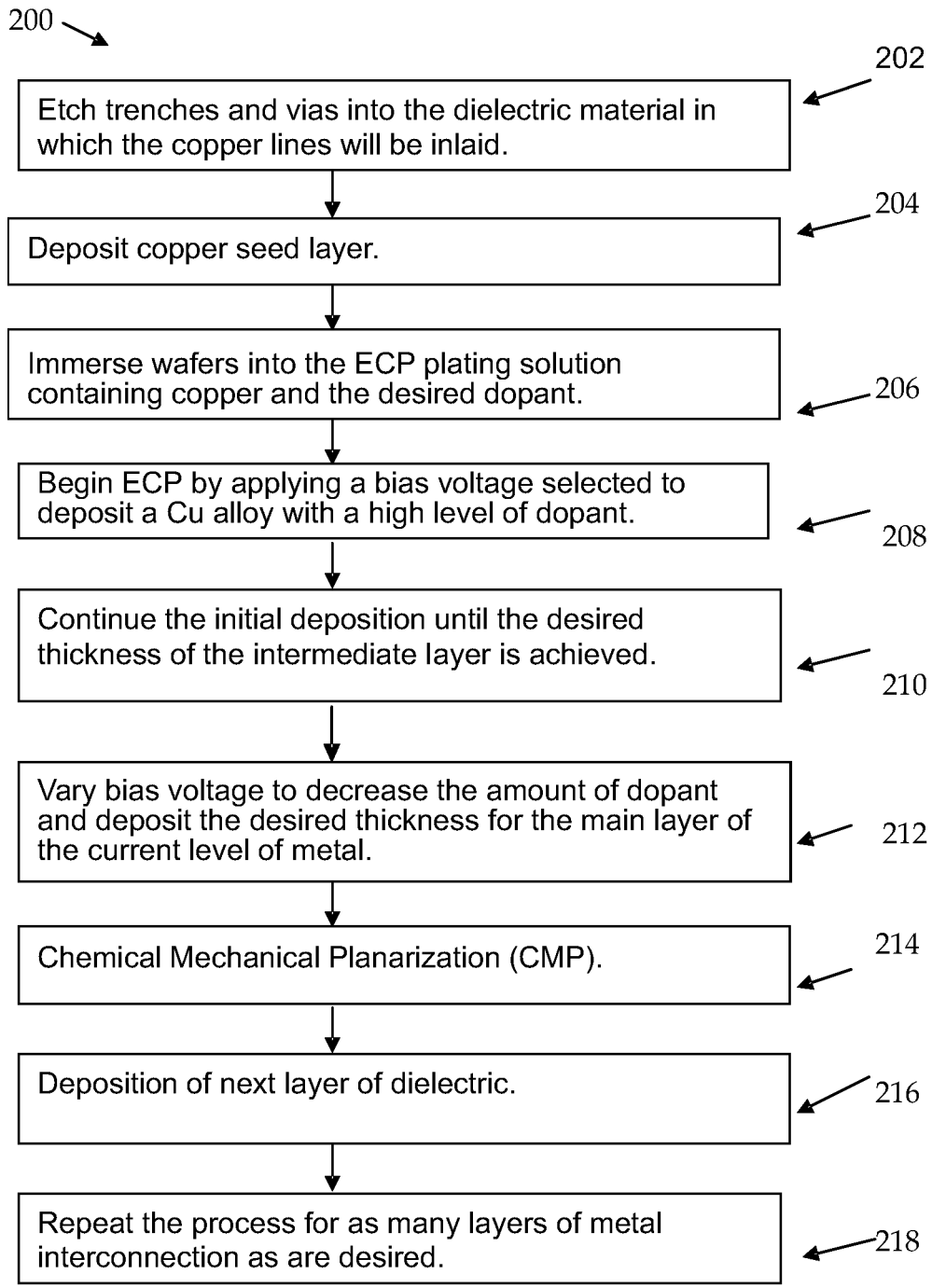
FIG. 2 is a flowchart showing the steps for fabricating the metal interconnect.

FIG. 2 is a flowchart 200 illustrating the steps for making the Cu interconnects. In step 202, the wafer has been completed through the standard steps of the Dual-Damascene metalization process. That is, the vias and trenches have already been etched into the underlying dielectric insulation layer. In step 204, a very thin, highly continuous "seed" layer of Cu is deposited. In step 206 the wafers are introduced into a chemical bath for the purpose of depositing an "intermediate" metal layer. This intermediate layer is to be deposited by an electroplating process. This plating voltage is applied in step 208 and continues in step 210 for a predetermined time period required to achieve the desired thickness for this intermediate metal layer.

The next step 212, according to this example, is to deposit another layer of Cu metal, by simply adjusting the plating voltage so as to minimize the dopant concentration in this main layer of metal. This step 212 is done without interrupting the deposition process. This main layer of Cu is of a thickness such that wide metal areas have the desired minimum thickness.

The next step 214 is the standard CMP process-step used to remove all traces of metal (seed layer, intermediate layer, and main layer) located outside the trenches and higher than the desired final top edges of the dielectric.

At this point the current level of metalization is complete. If another level of metalization is to be fabricated, in step 216 a next layer of dielectric insulation would be deposited, and the next level of DM/DDM metal would be formed in similar fashion to the level just described in step 218. If the current level is the last metal level then instead would come a so-called passivation (protective insulating) layer deposition (not shown).

In another example, instead of a 2-step ECP process, the complete profile composition of the current metal level is controlled by continuously varying the plating bias to achieve as complex a series of layer as might be beneficial.

Various benefits are achieved over conventional approaches. The standard stress migration at 500 hours property has shown to be greatly improved with Tin doped Cu replacing the pure Cu all through for the interconnects. Table I below illustrates the EM feature improvement with 2-5 times increase in terms of the standard $T_{50}/J_{max}$.

TABLE I

| Wafer Lots | 1 | 2 | 3 |
|---|---|---|---|
| Cu Alloy % | Cu Only | Cu + 0.5% Sn | Cu + 0.5% Sn |
| $J_{stress}$ (A/cm2) | 2.0E + 06 | 2.0E + 06 | 2.0E + 06 |
| Temp. (C.) | 350 | 350 | 350 |
| Ri | 178.3 | 173 | 175.7 |
| $T_{50}$ (hr) | 30.13 | 102.85 | 114.06 |
| $T_{0.1}$ (hr) | 1.36 | 9.23 | 5.66 |
| $J_{max}$ Ea = 0.8 n = 2 | 7.85E + 05 | 2.05E + 06 | 1.60E + 06 |

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for fabricating a metal alloy interconnect in a semiconductor device, the method comprising:
    defining an interconnect boundary profile, comprising vias or trenches, on a substrate material;
    plating a primary metal and one or more impurity metals together to form a first layer of interconnect along the interconnect boundary profile, wherein the first layer of interconnect comprising a primary metal and one or more impurity metals; and
    plating a primary metal and one or more impurity metals together to form a second layer of interconnect over the first layer of interconnect, wherein the second layer of interconnect comprising the primary metal with one or more impurity metals, wherein the second layer of interconnect is thicker than the first layer of interconnect and the second layer of interconnect has a lower electrical resistance than the first layer of interconnect.

2. The method of claim 1, wherein the impurity metals have lower reduction potential than the primary metal.

3. The method of claim 1, wherein the second layer of interconnect has a lower concentration of impurity metals than the first layer of interconnect.

4. The method of claim 1, wherein the plating processes include at least one electro-chemical plating process or at least one electroless plating process.

5. The method of claim 1, wherein the plating processes include adjusting plating temperatures in the processes, thereby adjusting a thermal budget for plating the metal alloy interconnect layers.

6. The method of claim 1, further comprising depositing a seed layer comprising the primary metal on the substrate before plating the first layer of interconnect, wherein the seed layer is underneath the first layer of interconnect.

7. The method of claim 6, wherein the primary metal comprises Cu.

8. The method of claim 6, wherein the seed layer is plated on the substrate.

9. The method of claim 6, wherein the seed layer is a pure primary metal.

10. The method of claim 1, wherein the one or more impurity metals is Sn.

11. The method of claim 1, wherein the first layer of interconnect substantially fills the vias for improved electromigration resistance of the vias.

12. A method for fabricating a metal alloy interconnect in a semiconductor device, the method comprising:
    defining an interconnect boundary profile, comprising vias or trenches, on a substrate material;
    depositing a seed layer comprising a primary metal along the interconnect boundary profile on the substrate material;
    plating the primary metal and one or more impurities together to form a first layer of interconnect over the seed layer, wherein the first layer of interconnect comprising the primary metal and one or more impurities; and
    plating the primary metal and one or more impurities together to form a second layer of interconnect over the first layer of interconnect, the second layer of interconnect comprising the primary metal and one or more impurities, wherein the second layer of interconnect is thicker than the first layer of interconnect and the second layer of interconnect has a lower electrical resistance than the first layer of interconnect.

13. The method of claim 12, wherein the impurities have lower reduction potential than the primary metal.

14. The method of claim 12, wherein the second layer of interconnect has a lower concentration of impurities than the first layer of interconnect.

15. The method of claim 12, wherein the plating steps include at least one electro-chemical plating process or at least one electroless plating process.

16. The method of claim 12, wherein the plating processes are further enhanced by adjusting plating temperatures in the processes, thereby adjusting a thermal budget for fabricating the metal alloy interconnect.

17. The method of claim 12, wherein the primary metal comprises Cu.

18. The method of claim 17, wherein the seed layer is a pure primary metal.

19. The method of claim 12, wherein the first layer of interconnect substantially fills the vias for improved electromigration resistance of the vias.

20. The method of claim 12, wherein the seed layer is plated on the substrate.

* * * * *